(12) United States Patent
Yu

(10) Patent No.: US 8,654,530 B1
(45) Date of Patent: Feb. 18, 2014

(54) HEAT TRANSFER APPARATUS AND METHOD FOR TRANSFERRING HEAT BETWEEN INTEGRATED CIRCUITS

(75) Inventor: Zhihai Zack Yu, Petaluma, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1392 days.

(21) Appl. No.: 11/873,246

(22) Filed: Oct. 16, 2007

(51) Int. Cl.
*H05K 7/20* (2006.01)

(52) U.S. Cl.
USPC ........... 361/700; 361/699; 361/702; 165/80.4

(58) Field of Classification Search
USPC ........ 361/699, 700, 704, 719; 174/15.2, 16.1, 174/16.3; 165/80.3, 80.4, 104.26; 257/715
See application file for complete search history.

(56) References Cited

U.S. PATENT DOCUMENTS

| | | | | |
|---|---|---|---|---|
| 4,012,770 A | * | 3/1977 | Pravda et al. ................. | 257/715 |
| 5,581,443 A | * | 12/1996 | Nakamura et al. ........... | 361/705 |
| 6,410,982 B1 | * | 6/2002 | Brownell et al. ............. | 257/714 |
| 6,621,698 B2 | * | 9/2003 | Chang ........................... | 361/687 |
| 6,717,811 B2 | * | 4/2004 | Lo et al. ........................ | 361/698 |
| 7,220,365 B2 | * | 5/2007 | Qu et al. ......................... | 252/70 |
| 7,295,437 B2 | * | 11/2007 | Lee et al. ...................... | 361/700 |
| 7,319,588 B2 | * | 1/2008 | Peng et al. .................... | 361/700 |
| 7,327,576 B2 | * | 2/2008 | Lee et al. ...................... | 361/719 |
| 7,382,616 B2 | * | 6/2008 | Stefanoski .................... | 361/698 |
| 7,405,937 B1 | * | 7/2008 | Wang et al. ................... | 361/700 |
| 7,440,278 B2 | * | 10/2008 | Cheng ........................... | 361/699 |
| 7,457,118 B1 | * | 11/2008 | French et al. ................. | 361/700 |
| 7,474,527 B2 | * | 1/2009 | Wu .......................... | 165/104.33 |
| 7,573,714 B2 | * | 8/2009 | Ali ................................. | 361/700 |
| 2008/0253082 A1 | * | 10/2008 | Lev et al. ...................... | 361/687 |

\* cited by examiner

*Primary Examiner* — Boris Chervinsky
(74) *Attorney, Agent, or Firm* — Zilka-Kotab, PC

(57) ABSTRACT

A heat transfer apparatus and method are provided for transferring heat between integrated circuits. In use, a heat transfer medium is provided with a first end in thermal communication with a first integrated circuit and a second end in thermal communication with a second integrated circuit. Furthermore, a single casting formed about the heat transfer medium and defining at least one heat sink is provided for thermal communication with the first integrated circuit or the second integrated circuit.

23 Claims, 5 Drawing Sheets

HEAT TRANSFER APPARATUS AND METHOD FOR TRANSFERRING HEAT BETWEEN INTEGRATED CIRCUITS

FIELD OF THE INVENTION

The present invention relates to heat exchangers, and more particularly to heat exchangers for use with integrated circuits.

BACKGROUND

Heat exchangers come in a variety of forms such as fans, heat sinks, heat pipes, etc. In the case of heat pipes, such heat transfer mediums are typically used to transfer heat between integrated circuits on a circuit board (e.g. between a northbridge and southbridge circuit, etc.). In some cases, round heat pipes are flattened for such purpose.

Since flattening round heat pipes typically results in a width insufficient to provide adequate heat transfer, etc., two heat pipes are typically used in a side-by-side relationship. However, such technique only allows a limited surface area to contact the corresponding integrated circuit and is often an inefficient use of space. Furthermore, thermal discontinuity between the heat pipes and/or the integrated circuits often results in a less than desirable heat transfer capability.

There is thus a need for addressing these and/or other issues associated with the prior art.

SUMMARY

A heat transfer apparatus and method are provided for transferring heat between integrated circuits. In use, a heat transfer medium is provided with a first end in thermal communication with a first integrated circuit and a second end in thermal communication with a second integrated circuit. Furthermore, a single casting formed about the heat transfer medium and defining at least one heat sink is provided for thermal communication with the first integrated circuit or the second integrated circuit.

DETAILED DESCRIPTION

Figure 1:
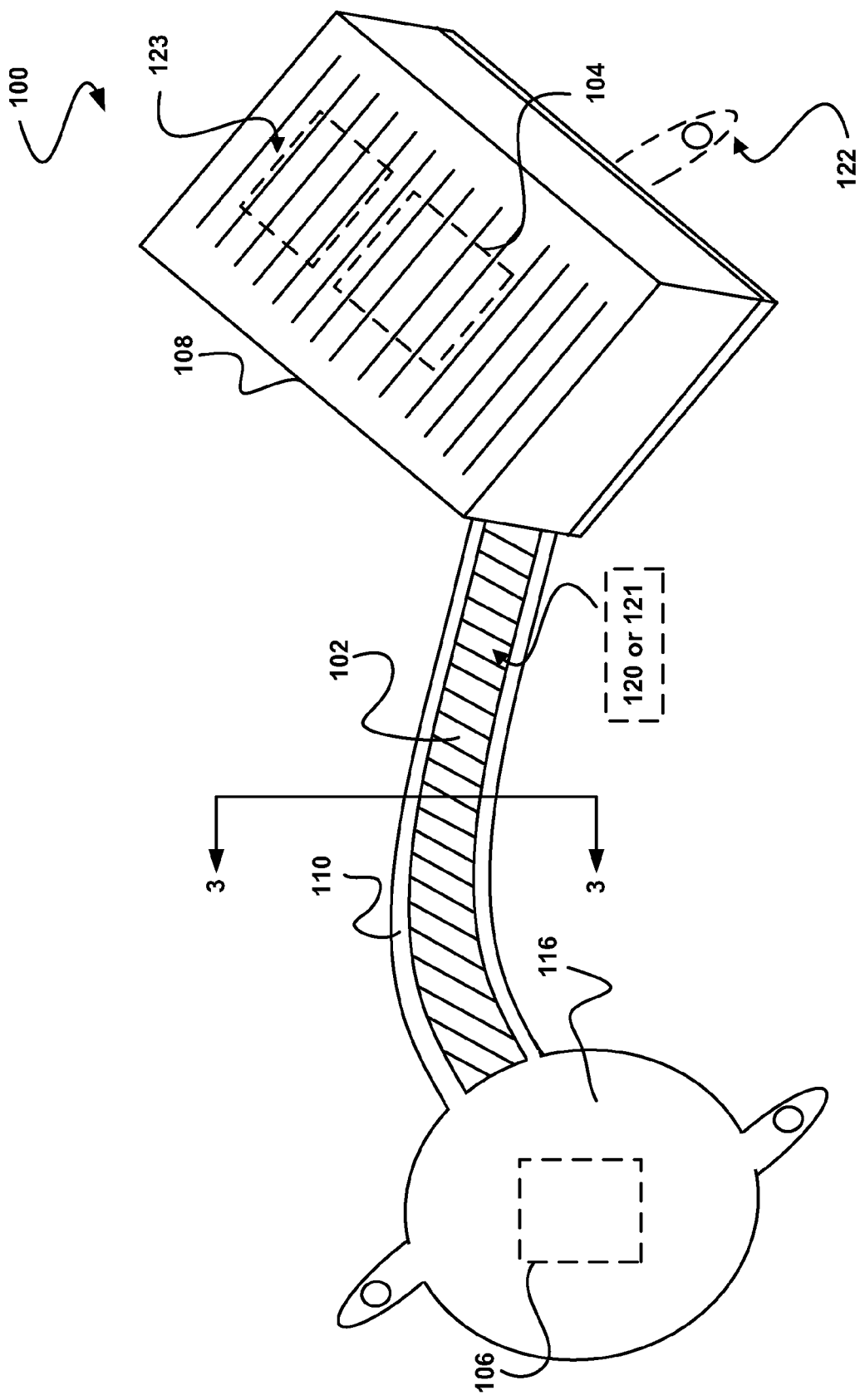
FIG. 1 shows a heat transfer apparatus for transferring heat between integrated circuits, in accordance with one embodiment.

FIG. 1 shows a heat transfer apparatus 100 for transferring heat between integrated circuits, in accordance with one embodiment. As shown, a heat transfer medium 102 is provided with a first end in thermal communication with a first integrated circuit 104 and a second end in thermal communication with a second integrated circuit 106.

In the context of the present description, a heat transfer medium refers to any medium capable of transferring heat. For example, in various embodiments, the heat transfer medium may include, but is not limited to a heat pipe 120, vapor chamber 121, hollow vessel for heat transfer, and/or any other medium that meets the above definition. Furthermore, in the context of the present description, the thermal communication refers to any ability to transfer heat from one object to another object.

Additionally, the first integrated circuit 104 and the second integrated circuit 106 may be any type of integrated circuit. In one embodiment, the first integrated circuit 104 and/or the second integrated circuit 106 may include a northbridge circuit and/or a southbridge circuit. For example, the first integrated circuit 104 may include a northbridge circuit and the second integrated circuit 106 may include a southbridge circuit.

In the context of the present description, the northbridge circuit may include any circuit that handles data transactions between a central processing unit, a graphics processor, and the southbridge circuit. Further, the southbridge circuit may include any circuit that manages onboard devices such as an integrated development environment (IDE) bus and a peripheral component interconnect (PCI) bus (not shown). While the northbridge and southbridge circuits are disclosed herein, it should be noted that other chipsets are contemplated that communicate with the central processing unit and controls interaction with any memory.

In one embodiment, a heat exchanger may be coupled to the first integrated circuit 104 and/or the second integrated circuit 106. For example, FIG. 1 shows a heat exchanger 108 coupled to the first integrated circuit 104. As an option, the heat exchanger 108 may be an active heat exchanger.

In this case, the heat exchanger 108 may include a fan 122 and/or a liquid-cooled system 123. In another embodiment, the heat exchanger 108 may be a passive heat exchanger. As an option, the passive heat exchanger may include a heat sink.

In still another embodiment, the heat transfer apparatus 100 may further include a second heat exchanger (not shown) coupled to the second integrated circuit 106. In this case, the first and the second heat exchangers may include a passive and/or an active heat exchanger. In various embodiments, the first and second heat exchangers may include a fan, a liquid cooling system, a heat sink, and/or any other component used with, or as, heat exchangers. For example, in one embodiment, the first heat exchanger may include a fan and the second heat exchanger may include a heat sink.

As shown further, a single casting 110 is formed about the heat transfer medium 102 and defines at least one heat sink (e.g. see item 116) for thermal communication with the first integrated circuit 104 and/or the second integrated circuit 106. In the context of the present description, a casting refers to any material used to cover at least part of the heat transfer medium 102 to define a heat sink. As an option, the casting may include an aluminum material.

By this design, the casting 110 may include a first portion that defines the heat sink(s), which is integrally formed with a second portion that is formed about the heat transfer medium 102. In other words, such first and second portions may be unitary in design. To accomplish this, the first portion and the second portion of the casting 110 may be formed using a single mold, or melded in any desired manner, etc. By virtue of such integral/unitary form, heat transfer may possibility be improved (e.g. as opposed to separate portions that merely mechanically abut, etc.).

Figure 2:
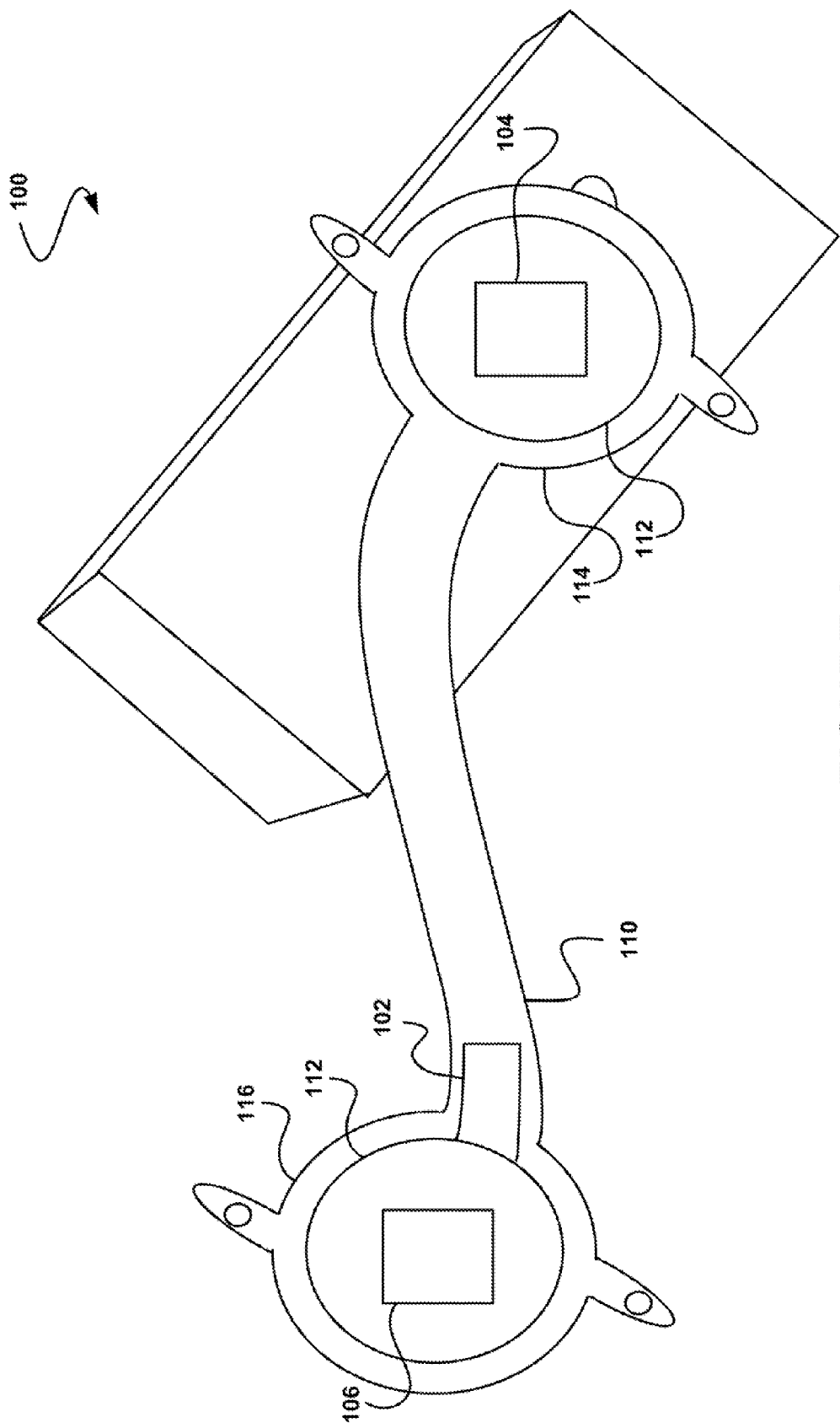
FIG. 2 shows a bottom view of the heat transfer apparatus of FIG. 1, in accordance with one embodiment.

FIG. 2 shows a bottom view of the heat transfer apparatus 100 of FIG. 1, in accordance with one embodiment. As shown, a single casting 110 is formed about the heat transfer medium 102 and defines at least one heat sink (e.g. items 114 and 116) for thermal communication with the first integrated circuit 104 and the second integrated circuit 106.

Strictly as an option, a block 112 may be positioned between the heat transfer medium 102 and the first integrated circuit 104 and/or the second integrated circuit 106. In one embodiment, the block 112 may include a copper material. In this case, the block 112 may serve as a highly conductive heat exchanger.

For example, the block 112 may exchange heat between the corresponding integrated circuit 104, 106 and the heat transfer medium 102. It should be noted that, although the heat transfer medium 102 is illustrated to be exposed in sections, the coverage of the casting 110 may vary, in other embodiments. For example, in one embodiment, the casting 110 may cover the entire heat transfer medium 102.

Such coverage of the casting 110 may depend on various criteria. For example, the coverage of the casting 110 may depend on a type of heat transfer medium (e.g. round heat pipe, flattened heat pipe, flat vapor chamber, etc.) utilized, a type of integrated circuit (e.g. northbridge circuit, southbridge circuit, etc.) utilized, whether additional heat exchangers (e.g. fans, heat sinks, etc.) are being utilized, and/or an available area or space for the casting 110.

In one embodiment, the single casting 110 may define a first heat sink 114 for thermal communication with the first integrated circuit 104 and a second heat sink 116 for thermal communication with the second integrated circuit 106. As an option, the first heat sink 114 and/or the second heat sink 116 may include a plurality of fins (not shown). In the context of the present description, such fins refer to any protrusion or depression which increases a surface area of an object (e.g. a heat sink, etc.). For example, in various embodiments, the fins may include, but are not limited to pins, ribs, ledges, grooves, and/or any other protrusion or depression that meets the above definition.

Figure 3:
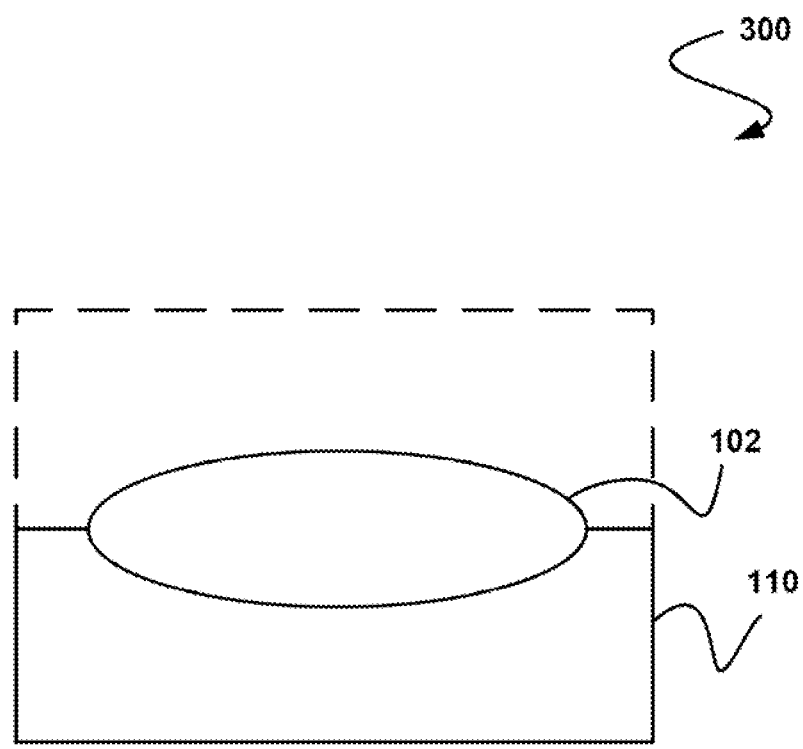
FIG. 3 shows a cross section of a heat transfer medium and a casting taken along line 3-3 shown in FIG. 1, in accordance with one embodiment.

FIG. 3 shows a cross section of the heat transfer medium 102 and the casting 110 taken along line 3-3 shown in FIG. 1, in accordance with one embodiment. As shown, the heat transfer medium 102 may be a heat pipe. In various embodiments, the heat pipe may be a round heat pipe, a flattened pipe, an oblong heat pipe, or a rectangular heat pipe. In one embodiment, the heat pipe may have been a heat pipe with a round cross-section, which was flattened after manufacture into an oblong shape. In another embodiment, the heat transfer medium 102 may be a flat vapor chamber.

In the context of the present description, a vapor chamber refers to any chamber capable of transporting or transferring heat. For example, in various embodiments, a vapor chamber may include, but is not limited to a sealed hollow vessel for heat transfer, a sealed square or rectangular pipe, and/or any other chamber that meets the above definition. Furthermore, in the context of the present description, the thermal communication refers to the ability to transfer heat from one object to another object.

Still yet, the term flat vapor chamber refers to a vapor chamber (as defined above) that is originally manufactured to take on a flattened configuration. In other words, the flat vapor chamber is initially formed in a flattened configuration, without necessarily requiring any post-manufacture flattening. By using a vapor chamber which takes on such an initial-state flat configuration, a device may possibly be provided with a lower profile and a more effective heat transfer capability.

As an option, the flat vapor chamber may be comprised of copper sheet metal. In this case, the copper sheet metal may be bonded together to form the flat vapor chamber. In one embodiment, the flat vapor chamber may be a singular piece of folded sheet metal.

Of course, the heat transfer medium 102 may include any type of material capable of transporting or transferring heat. For example, the heat transfer medium 102 may include a thermoconductive material such as aluminum or copper. Strictly as an option, the heat transfer medium 102 may contain a small quantity of a fluid or coolant (e.g. water, ethanol, mercury, etc.).

Furthermore, the casting 110 may include a groove or track, in which the heat transfer medium 102 may be positioned. In one embodiment, a plurality of heat transfer mediums may be utilized. In such embodiment, the casting 110 may include a plurality of tracks for positioning the heat transfer mediums 110.

Additionally, the casting 110 may cover a portion of the heat transfer medium 102 or the entire heat transfer medium 102. For example, in one embodiment, a lower portion of the heat transfer medium 102 may be covered by the casting. In another embodiment, the casting 110 may entirely surround the heat transfer medium 102. Of course, any portion of the heat transfer medium 102 may be covered by the casting 110.

It should be noted that the width of the casting 110 may vary in different embodiments. In one embodiment, the width of the casting 110 may depend on the first integrated circuit 104 and/or the second integrated circuit 106. In this case, various characteristics of the integrated circuits 104 and 106 may govern the width of the casting 110. For example, in various embodiments, such characteristics of the integrated circuits 104 and 106 may include, but are not limited to a size, a type, an operating temperature, a power consumption, a particular use, and/or various other characteristics of the integrated circuits 104 and 106.

In another embodiment, a system configuration may determine the width of the casting 110. For example, a system in which the casting 110 is utilized may determine the maximum allowable width of the casting 110. It should be noted that increasing the width of the casting 110 also increases the surface area exposed to the air. Thus, in certain situations, it may be desired to maximize the width of the casting 110, to the extent possible.

Still yet, the heat transfer medium 102 may determine the width of the casting 110. For example, the width of the heat transfer medium 102 may determine how much additional surface area to add using the casting 110, such that the surface area which is exposed to the air is adequate. In one embodiment, the flat vapor chamber 102 itself may have a width of 10 mm, 15 mm, 20 mm, 25 mm or more.

In another embodiment, the casting 110 may contribute to the width of the heat transfer medium 102. For example, the heat transfer medium 102 may have a width of 8 to 10 mm, and with the casting, the total width may be 25 mm or more. It should be noted, however, that the casting 110 may be configured in any manner such that the width is adequately augmented for a particular system.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 4:
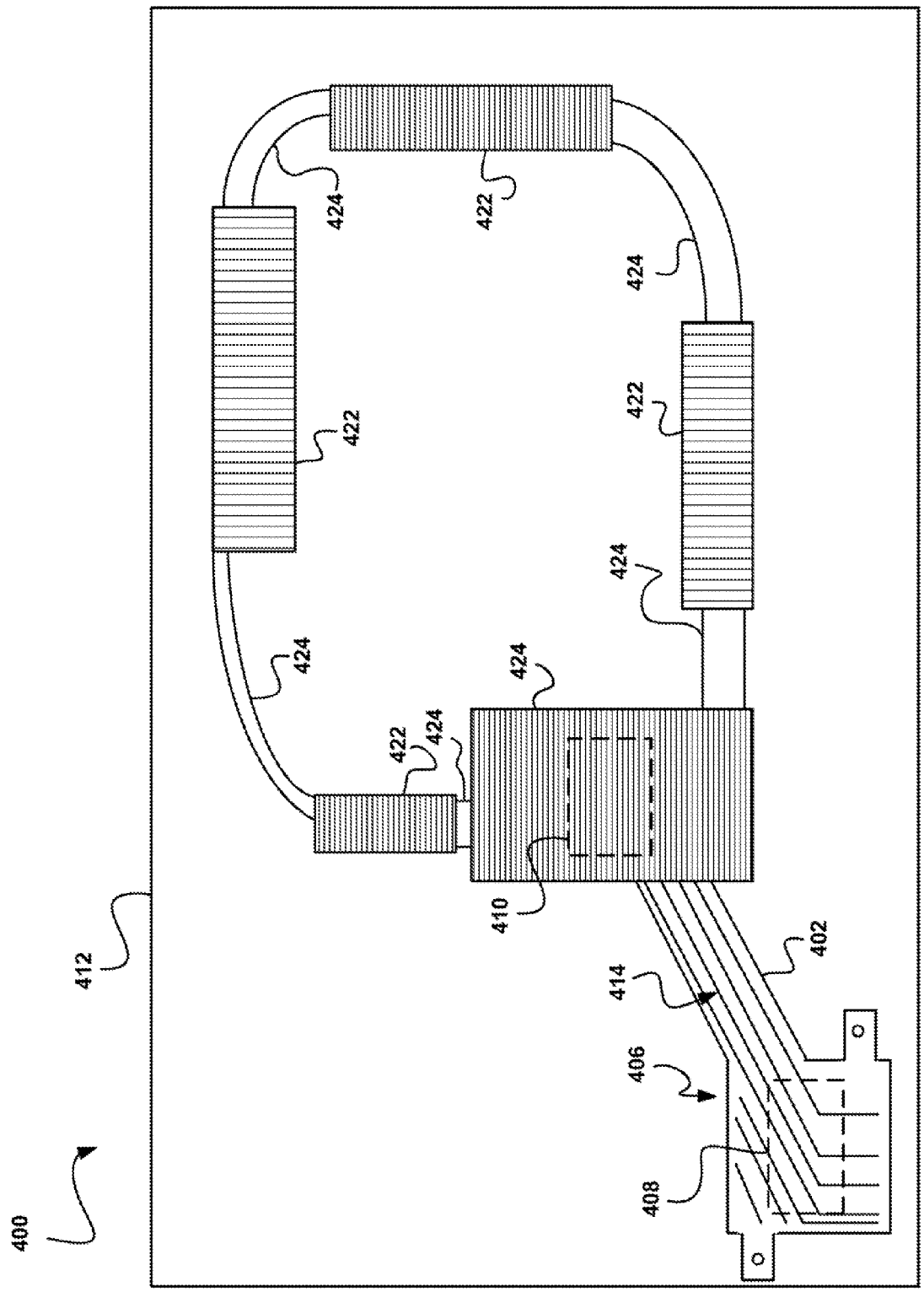
FIG. 4 shows a system for transferring heat between integrated circuits, in accordance with another embodiment.

FIG. 4 shows a system 400 for transferring heat between integrated circuits, in accordance with another embodiment. In use, the single casting 402 is formed about the heat transfer medium (not shown) and defines at least one heat sink (e.g. see item 406) for thermal communication with a first integrated circuit 408 and/or a second integrated circuit 410. As an option, the first integrated circuit 408 and the second integrated circuit 410 may be mounted on a circuit board 412 (a portion of which is shown).

In one embodiment, the circuit board 412 may be a mother board. The mounting of the first integrated circuit 408 and the second integrated circuit 410 may vary depending on the integrated circuits. For example, in one embodiment, the first integrated circuit 408 and/or the second integrated circuit 410 may be a flip chip component.

In the context of the present description, a flip chip refers to any electronic component or semiconductor device that may be mounted directly onto a substrate, circuit board, or carrier without the use of wirebonds. In another embodiment, the first integrated circuit 408 and/or the second integrated circuit 410 may be wirebounded to the circuit board 412.

As shown further, the heat sink 406 may include a plurality of fins 414. Strictly as an option, the fins 414 may be formed in the casting 402. Of course, in various embodiments, the casting 402 and/or the heat sink 406 may or may not include the fins 414.

In addition to the first integrated circuit 408 and the second integrated circuit 410 being in thermal communication, the two integrated circuits may also be in thermal communication with a plurality of other integrated circuits. For example, a plurality of heat exchangers 422 may serve to dissipate heat from such other integrated circuits (not shown). In this case, the plurality of integrated circuits may be in thermal communication with one another via the various heat transfer mediums 424 and the heat exchangers 422.

In different embodiments, the heat transfer mediums 424 may include heat pipes, flat vapor chambers, and/or any other heat transfer mediums. Furthermore, as an option, the heat transfer mediums 424 may include castings. Still yet, the heat exchangers 422 may each include any type of passive and/or active heat exchanger.

Figure 5:
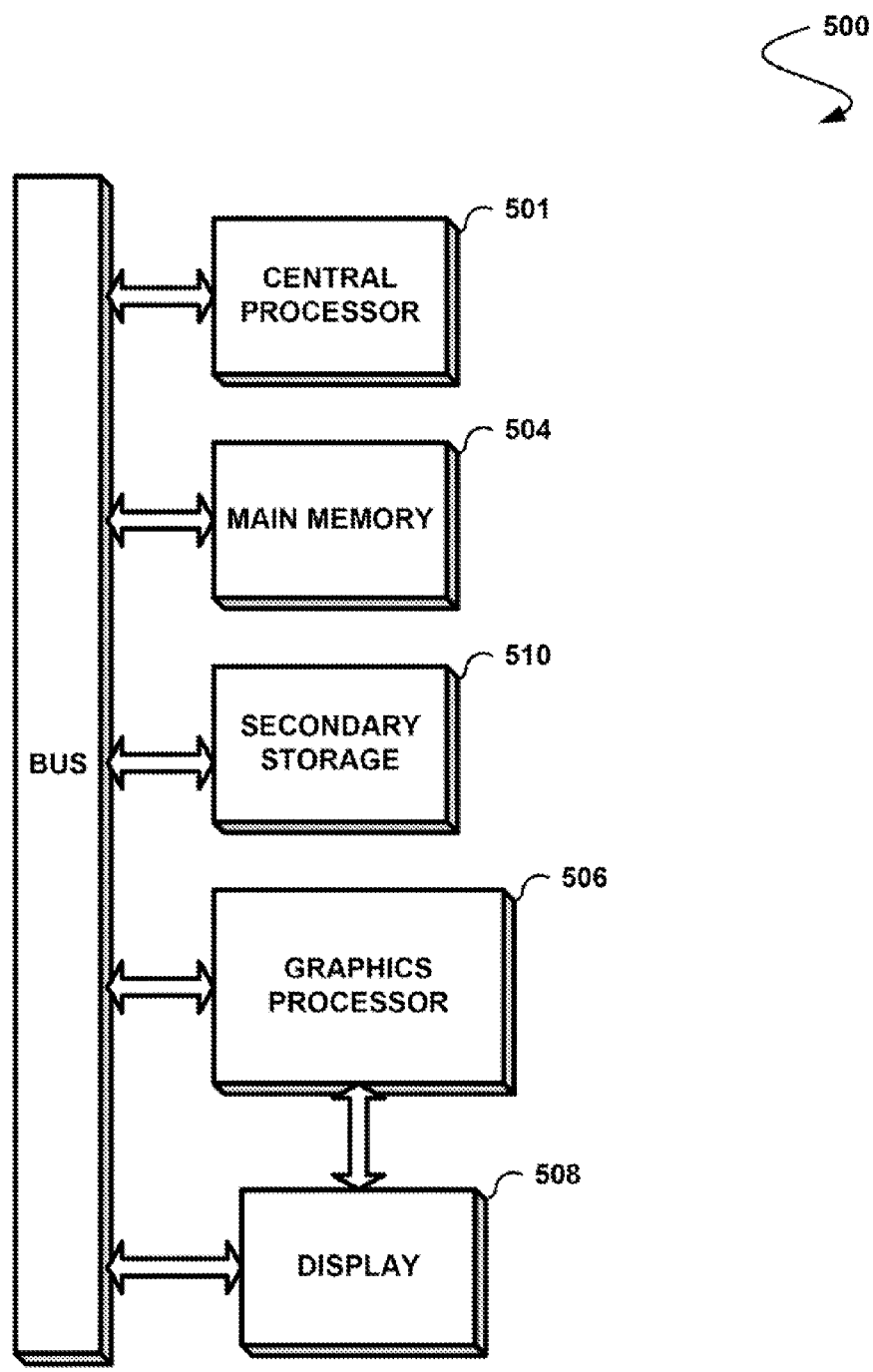
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one host processor 501 which is connected to a communication bus 502. The system 500 also includes a main memory 504. Control logic (software) and data are stored in the main memory 504 which may take the form of random access memory (RAM).

The system 500 also includes a graphics processor 506 and a display 508, i.e. a computer monitor. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, an integrated circuit (not shown) that is capable of at least a portion of the capabilities of both the host processor 501 and the graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, lap-top computer, and/or any other type of logic. Still yet, the system 500 may take the form of various other devices m including, but not limited to a personal digital assistant (PDA) device, a mobile phone device, a television, etc.

Further, while not shown, the system 500 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   a heat transfer medium including at least one of a heat pipe and a vapor chamber with a first end in thermal communication with a first integrated circuit and a second end in thermal communication with a second integrated circuit; and
   a single casting formed about the heat transfer medium and defining at least one heat sink for thermal communication with at least one of the first integrated circuit and the second integrated circuit.

2. The apparatus of claim 1, wherein the single casting defines a first heat sink for thermal communication with the first integrated circuit and a second heat sink for thermal communication with the second integrated circuit.

3. The apparatus of claim 1, wherein the casting includes an aluminum material.

4. The apparatus of claim 1, wherein the at least one heat sink includes a plurality of fins.

5. The apparatus of claim 1, wherein the vapor chamber includes a flat vapor chamber.

6. The apparatus of claim 1, wherein at least one of the first integrated circuit and the second integrated circuit includes at least one of a northbridge circuit and a southbridge circuit.

7. The apparatus of claim 1, wherein the first integrated circuit includes a northbridge circuit and the second integrated circuit includes a southbridge circuit.

8. The apparatus of claim 1, and further comprising a heat exchanger coupled to at least one of the first integrated circuit and the second integrated circuit.

9. The apparatus of claim 8, wherein the heat exchanger is an active heat exchanger.

10. The apparatus of claim 9, wherein the active heat exchanger includes at least one of a fan and a liquid-cooled system.

11. The apparatus of claim 8, wherein the heat exchanger is a passive heat exchanger.

12. The apparatus of claim 11, wherein the passive heat exchanger includes a heat sink.

13. The apparatus of claim 1, and further comprising a first heat exchanger coupled to the first integrated circuit and a second heat exchanger coupled to the second integrated circuit.

14. The apparatus of claim 1, wherein the first integrated circuit and the second integrated circuit are mounted on a mother board.

15. The apparatus of claim 1, and further comprising a block positioned between the heat transfer medium and at least one of the first integrated circuit and the second integrated circuit.

16. The apparatus of claim 15, wherein the block includes a copper material.

17. The apparatus of claim 1, wherein the heat transfer medium has a width of at least 10 mm.

18. A method, comprising:
   providing a heat transfer medium including at least one of a heat pipe and a vapor chamber;
   mounting a first end of the heat transfer medium in thermal communication with a first integrated circuit;
   mounting a second end of the heat transfer medium in thermal communication with a second integrated circuit; and
   forming a casting about the heat transfer medium which defines at least one heat sink for thermal communication with at least one of the first integrated circuit and the second integrated circuit.

19. A system, comprising:
   a circuit board with a first integrated circuit and a second integrated circuit mounted thereon;
   a heat transfer medium including at least one of a heat pipe and a vapor chamber with a first end in thermal communication with the first integrated circuit and a second end in thermal communication with the second integrated circuit; and
   a single casting formed about the heat transfer medium and defining at least one heat sink for thermal communication with at least one of the first integrated circuit and the second integrated circuit.

20. The system of claim 19, wherein the circuit board is a component of a computer coupled to a display.

21. The apparatus of claim 1, wherein the casting contributes to a width of the heat transfer medium.

22. The apparatus of claim 1, wherein the heat transfer medium determines a width of the casting.

23. The apparatus of claim 1, wherein the casting covers the entire heat transfer medium.

* * * * *